United States Patent
Tokuno et al.

(10) Patent No.: US 10,197,618 B2
(45) Date of Patent: Feb. 5, 2019

(54) INTER-TERMINAL CAPACITANCE MEASUREMENT METHOD FOR THREE-TERMINAL DEVICE AND APPARATUS FOR THE SAME

(71) Applicant: Keysight Technologies, Inc., Minneapolis, MN (US)

(72) Inventors: Koji Tokuno, Tokyo (JP); Yoshimi Nagai, Tokyo (JP)

(73) Assignee: Keysight Technologies, Inc., Santa Rosa, CA (US)

( * ) Notice: Subject to any disclaimer, the term of this patent is extended or adjusted under 35 U.S.C. 154(b) by 355 days.

(21) Appl. No.: 14/691,799

(22) Filed: Apr. 21, 2015

(65) Prior Publication Data
US 2015/0309109 A1    Oct. 29, 2015

(30) Foreign Application Priority Data
Apr. 24, 2014 (JP) ................................ 2014-090325

(51) Int. Cl.
*G01R 27/26*       (2006.01)
*G01R 31/26*       (2014.01)

(52) U.S. Cl.
CPC ..... *G01R 31/2607* (2013.01); *G01R 31/2601* (2013.01)

(58) Field of Classification Search
CPC .................. G01R 31/2607; G01R 31/2601
USPC ......................................... 324/658–690, 548
See application file for complete search history.

(56) References Cited

U.S. PATENT DOCUMENTS

| 6,531,882 B2 | 3/2003 | Morikawa et al. |
| 6,731,129 B1 | 5/2004 | Belluomini et al. |
| 6,998,869 B2 | 2/2006 | Tanida et al. |
| 8,708,916 B2 | 4/2014 | Okuno |

(Continued)

FOREIGN PATENT DOCUMENTS

| JP | 63275965 A  *  11/1988 ............. G01R 27/02 |
| JP | H07-300933 A    11/1995 |

(Continued)

OTHER PUBLICATIONS

Espacenet translate—JP1988275965 JPS63275965.*

(Continued)

*Primary Examiner* — Melissa Koval
*Assistant Examiner* — Courtney McDonnough

(57) ABSTRACT

Provided are a measurement apparatus and a measurement method capable of measuring inter-terminal capacitances of a three-terminal device while reproducibility is high and influences of residual inductances are cancelled. The measurement apparatus includes: a route selector including a first terminal, a second terminal, a third terminal, a fourth terminal, a fifth terminal, and a sixth terminal, the fourth to sixth terminals being configured to connect to any of the first to third terminals; an LCR meter; a device under test, which is a three-terminal device; first, second, and third cables for respectively connecting the fourth to sixth terminals of the first route selector and first, second, and third terminals of the device under test to each other; and fourth, fifth, and sixth cables for respectively connecting the first to third terminals of the first route selector and first, second, and third terminals of the LCR meter to each other.

14 Claims, 15 Drawing Sheets

(56) References Cited

U.S. PATENT DOCUMENTS

2005/0237079 A1* 10/2005 Tanida ............... G01R 31/2844
324/762.01
2015/0309109 A1 10/2015 Tokuno et al.

FOREIGN PATENT DOCUMENTS

| JP | 08-130749 A | 5/1996 |
| JP | H08-130149 A | 5/1996 |
| JP | 2001-330634 A | 11/2001 |
| JP | 2005-300495 A | 10/2005 |
| JP | 2005-331520 A | 12/2005 |
| JP | 2015-210120 A | 11/2015 |
| WO | 2011129301 A1 | 10/2011 |

OTHER PUBLICATIONS

"Agilent Impedance Measurement Handbook, a guide to measurement technology and techniques, 4th Edition", Agilent Technologies, Inc., Sep. 10, 2013.
Japan Office Action dated Feb. 2, 2018 with English translation.
Japanese Office Action dated Feb. 2, 2018, pp. 1-3.
Japanese Notice of Allowance dated Oct. 11, 2018, 6 pgs.

* cited by examiner

INTER-TERMINAL CAPACITANCE MEASUREMENT METHOD FOR THREE-TERMINAL DEVICE AND APPARATUS FOR THE SAME

CROSS-REFERENCE TO RELATED APPLICATIONS

The present application claims priority under 35 U.S.C. § 119(e) from Japanese Patent Application No. 2014-090325 filed on Apr. 24, 2014 naming Koji Tokuno, et al. as inventors. The entire disclosure of Japanese Patent Application No. 2014-090325 is specifically incorporated herein by reference.

BACKGROUND

Inter-terminal capacitances of a three-terminal semiconductor device such as a transistor, an FET, a power MOS FET, and an IGBT are represented, for example, as Cgs, Cds, and Cgd for the case of the FET and described on a datasheet of the device, and can be represented as a delta connection circuit (delta circuit) including three terminals (refer to FIG. 9 to be described later).

On the other hand, generally, electrostatic capacitances of a semiconductor device and the like can be measured through use of an LCR meter, which is also known as an impedance meter. The LCR meter generally measures an AC signal between two terminals, and when the three-terminal semiconductor device including three capacitances connected as the delta configuration is measured, as illustrated in FIGS. 5-29(a) and 5-29(b) of "Agilent Impedance Measurement Handbook, A guide to measurement technology and techniques, 4th Edition", Agilent Technologies, Inc., Sep. 10, 2013, it is known that high-side and low-side measurement terminals of the LCR meter are connected to two terminals out of the three terminals of the semiconductor device, and an AC guard of the LCR meter is connected to the remaining one terminal for measurement. It should be noted that the AC guard connection is briefly described in Section 2.4.7 on page 2-14 in "Agilent Impedance Measurement Handbook, A guide to measurement technology and techniques, 4th Edition".

FIG. 9 illustrates a measurement circuit when a measurement circuit using an LCR meter of four-terminal connection illustrated in FIG. 5-29(b) of "Agilent Impedance Measurement Handbook, A guide to measurement technology and techniques 4th Edition" is applied to a case in which an LCR meter of two-terminal connection is used for measuring a MOS FET.

In FIG. 9, in a measurement circuit 900, as a device under test (DUT), a MOS FET 106 including three terminals of a drain (D), a gate (G), and a source (S) is illustrated. A high-side terminal H of an LCR meter 102 of three-terminal connection is connected to the terminal D of the DUT via a cable 902, a low-side terminal L of the LCR meter 102 is connected to the terminal G via a cable 904, and a guard terminal GD of the LCR meter 102 is connected to the terminal S via a cable 906. A voltage between both ends of a capacitance Cgd is measured as a voltage Vm by a voltmeter 110, and a current flowing through the capacitance Cgd is measured as a current Im by an ammeter 114. A current Ie flowing through a capacitance Cds does not flow through the ammeter 114 due to the use of the terminal GD, and the current and the voltage relating to the capacitance Cgd can thus be precisely measured. It should be noted that, as illustrated in FIG. 9, the LCR meter 102 includes a signal source 108 and a ground point 112. Moreover, the virtual capacitances Cgs, Cds, and Cgd are connected in a delta configuration, and exist among the terminals of the DUT 106.

For an apparatus manufacturer which designs a circuit having a three-terminal device built therein, it is important to measure the inter-terminal capacitances of this device on an actual device, and to compare the measured capacitances with parameters on a datasheet, thereby evaluating a performance of the device.

Incidentally, for the measurement of the inter-terminal capacitances of the three-terminal device, as power devices and the like such as a power MOS FET, an IGBT, and the like have developed in recent years, bias voltages to be applied to the respective terminals increase regarding the inter-terminal capacitances. Thus, such an inconvenience that those bias voltages cannot be covered by bias voltages of the related-art LCR meter occurs, and hence there are increasing numbers of cases in which the measurement cannot be easily carried out.

SUMMARY

The present invention has an object to provide a measurement apparatus and a measurement method capable of measuring inter-terminal capacitances of a three-terminal device with high accuracy while reproducibility is high and influences of residual inductances are cancelled.

According to one embodiment of the present invention, there is provided a method of measuring an inter-terminal capacitance of a device having three terminals under test, including: a route selector including a first terminal connected to a high-side terminal of an LCR meter, a second terminal connected to a low-side terminal of the LCR meter, a third terminal connected to a guard terminal of the LCR meter, a fourth terminal for connecting to a first terminal of the device under test, a fifth terminal for connecting to a second terminal of the device under test, and a sixth terminal for connecting to a third terminal of the device under test, the fourth terminal to the sixth terminal being configured to connect to any of the first terminal to the third terminal; a first cable connected to the fourth terminal of the route selector, a second cable connected to the fifth terminal; and a third cable connected to the sixth terminal, the method including: carrying out, in order to acquire error impedances for routes to the respective terminals of the device under test, measurement for three connections of the route selector: carrying out, in order to acquire impedances of respective inter-terminal capacitances including errors of residual inductances for the device under test, measurement for the three connections of the route selector; and acquiring the respective inter-terminal capacitances of the device under test for which influences of the residual inductances are cancelled from measurement results obtained in the carrying out of the measurement in order to acquire the error impedances and in the carrying out of the measurement in order to acquire the impedances of the respective inter-terminal capacitances.

In this case, the method includes the following aspect. Specifically, the carrying out of the measurement in order to acquire the error impedances includes: short-circuiting terminals of the first cable, the second cable, and the third cable which are not connected to the route selector with one another; and connecting the first terminal and the second terminal of the route selector respectively to the fifth terminal and the sixth terminal, to thereby measure a first voltage and a first current by using the LCR meter, connecting the first terminal and the second terminal of the route selector respectively to the fourth terminal and the sixth terminal, to thereby measure a second voltage and a second current by using the LCR meter, and connecting the first terminal and the second terminal of the route selector respectively to the fourth terminal and the fifth terminal, to thereby measure a third voltage and a third current by using the LCR meter; the carrying out of the measurement in order to acquire the impedances of the respective inter-terminal capacitances includes: connecting the terminals of the first cable, the second cable, and the third cable which are not connected to the route selector respectively to the first terminal, the second terminal, and the third terminal of the device under test; and configuring the route selector so that the first terminal of the route selector is connected to the fifth terminal, the second terminal of the route selector is connected to the sixth terminal, and the third terminal of the route selector is connected to the fourth terminal, to thereby measure a fourth voltage and a fourth current by using the LCR meter, configuring the route selector so that the first terminal of the route selector is connected to the fourth terminal, the second terminal of the route selector is connected to the sixth terminal, and the third terminal of the route selector is connected to the fifth terminal, to thereby measure a fifth voltage and a fifth current by using the LCR meter, and configuring the route selector so that the first terminal of the route selector is connected to the fourth terminal, the second terminal of the route selector is connected to the fifth terminal, and the third terminal of the route selector is connected to the sixth terminal, to thereby measure a sixth voltage and a sixth current by using the LCR meter; and the acquiring of the respective inter-terminal capacitances of the device under test includes: acquiring a first impedance from the first voltage and the first current, acquiring a second impedance from the second voltage and the second current, and acquiring a third impedance from the third voltage and the third current; acquiring an impedance of the first cable, an impedance of the second cable, and an impedance of the third cable from the first impedance to the third impedance: acquiring a fourth impedance from the first terminal of the route selector via the fifth terminal to an end of the second cable, a fifth impedance from the second terminal of the route selector via the sixth terminal to an end of the third cable, a sixth impedance from the third terminal of the route selector via the fourth terminal to an end of the first cable, a seventh impedance from the first terminal of the route selector via the fourth terminal to the end of the first cable, an eighth impedance from the third terminal of the route selector via the fifth terminal to the end of the second cable, a ninth impedance from the second terminal of the route selector via the fifth terminal to the end of the second cable, and a tenth impedance from the third terminal of the route selector via the sixth terminal to the end of the third cable; acquiring an eleventh impedance from the fourth voltage and the fourth current, acquiring a twelfth impedance from the fifth voltage and the fifth current, and acquiring a thirteenth impedance from the sixth voltage and the sixth current; and assigning the fourth impedance to the thirteenth impedance to three simultaneous equations based on Kirchhoff's laws relating to a circuit for measuring the fourth voltage to the sixth voltage and the fourth current to the sixth current, thereby acquiring a fourteenth impedance, a fifteenth impedance, and a sixteenth impedance representing the respective inter-terminal capacitances of the three terminals of the device under test through a numerical analysis method.

Furthermore, the method includes: an aspect in which the route selector superimposes a seventh voltage, an eighth voltage, and a ninth voltage respectively on signals connected to the fourth terminal to the sixth terminal; an aspect in which the acquiring of the fourteenth impedance, the fifteenth impedance, and the sixteenth impedance includes using a simplex method for the numerical analysis method; and an aspect in which the first terminal of the route selector is connected to a high-side current terminal and a high-side voltage terminal of the LCR meter, and the second terminal of the route selector is connected to a low-side current terminal and a low-side voltage terminal of the LCR meter.

According to one embodiment of the present invention, there is provided a route selector, including: a first terminal; a second terminal; a third terminal; a fourth terminal; a fifth terminal; and a sixth terminal, in which the fourth terminal to the sixth terminal are configured to connect to any of the first terminal to the third terminal.

In this case, the route selector includes: an aspect in which the route selector is configured to superimpose a seventh voltage, an eighth voltage, and a ninth voltage on signals connected from any of the first terminal to the third terminal to the fourth terminal to the sixth terminal; and an aspect in which the configuration of the route selector capable of superimposing the seventh voltage, the eighth voltage, and the ninth voltage includes a first bias tee, a second bias tee, and a third bias tee corresponding to signal lines respectively connected to the fourth terminal to the sixth terminal, and a seventh terminal, an eighth terminal, and a ninth terminal connected to the first bias tee to the third bias tee, and the route selector is configured to superimpose voltages applied to the seventh terminal to the ninth terminal on the signal lines respectively connected to the fourth terminal to the sixth terminal.

Furthermore, the route selector includes an aspect in which the route selector includes a tenth terminal and an eleventh terminal, the tenth terminal is connected to the first terminal, and the eleventh terminal is connected to the second terminal.

Furthermore, according to one embodiment of the present invention, there is provided a measurement apparatus, including: a first route selector that is the above-mentioned route selector; an LCR meter; a device under test, which is a three-terminal device; a first cable, a second cable, and a third cable for respectively connecting the fourth terminal to the sixth terminal of the first route selector and a first terminal, a second terminal, and a third terminal of the device under test to each other, and a fourth cable, a fifth cable, and a sixth cable for respectively connecting the first terminal to the third terminal of the first route selector and a first terminal, a second terminal, and a third terminal of the LCR meter to each other.

Here, the measurement apparatus includes: an aspect of executing the method of claim 1; an aspect in which the first terminal of the LCR meter is a high-side terminal, the second terminal of the LCR meter is a low-side terminal, and the third terminal of the LCR meter is a guard terminal; and an aspect in which the LCR meter is capable of superimposing voltages respectively on the first terminal to the third terminal.

Furthermore, the measurement apparatus includes: an aspect in which: the first route selector includes a tenth terminal and an eleventh terminal; the tenth terminal of the first route selector is connected to the first terminal; the eleventh terminal of the first route selector is connected to the second terminal; the LCR meter includes a fourth terminal and a fifth terminal; the first terminal and the fourth terminal of the LCR meter are high-side terminals; the second terminal and the fifth terminal of the LCR meter are low-side terminals; the third terminal of the LCR meter is a guard terminal; the fourth terminal of the LCR meter is connected to the tenth terminal of the first route selector via a seventh cable; and the fifth terminal of the LCR meter is connected to the eleventh terminal of the first route selector via an eighth cable; and an aspect in which the LCR meter is capable of superimposing voltages respectively on the first terminal to the fifth terminal.

Furthermore, the measurement apparatus includes an aspect in which the measurement apparatus further includes: a DC measurement apparatus for supplying a DC voltage of at least one channel; a second route selector capable of connecting any of the at least one channel of the DC measurement apparatus to a first terminal, a second terminal, and a third terminal of the second route selector; and a third route selector including the first route selector and the second route selector, capable of connecting one of the fourth terminal of the first route selector and the first terminal of the second router selector to a first terminal, capable of connecting one of the fifth terminal of the first route selector and the second terminal of the second router selector to a second terminal, and capable of connecting one of the sixth terminal of the first route selector and the third terminal of the second router selector to a third terminal, in which the first cable, the second cable, and the third cable connected to the first terminal, the second terminal, and the third terminal of the device under test are respectively connected to the first terminal, the second terminal, and the third terminal of the third route selector.

Figure 4:
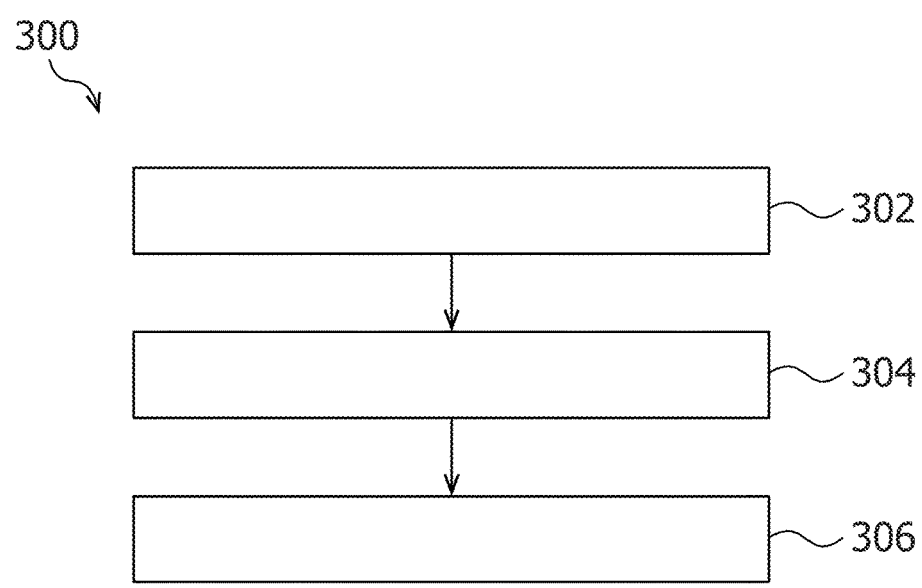
FIG. 4 is a flowchart illustrating a measurement method using the apparatus of FIG. 1.

FIG. SB is a diagram illustrating an equivalent circuit in the second route connection in Step 304 of the flowchart of FIG. 4.

Figure 5A:
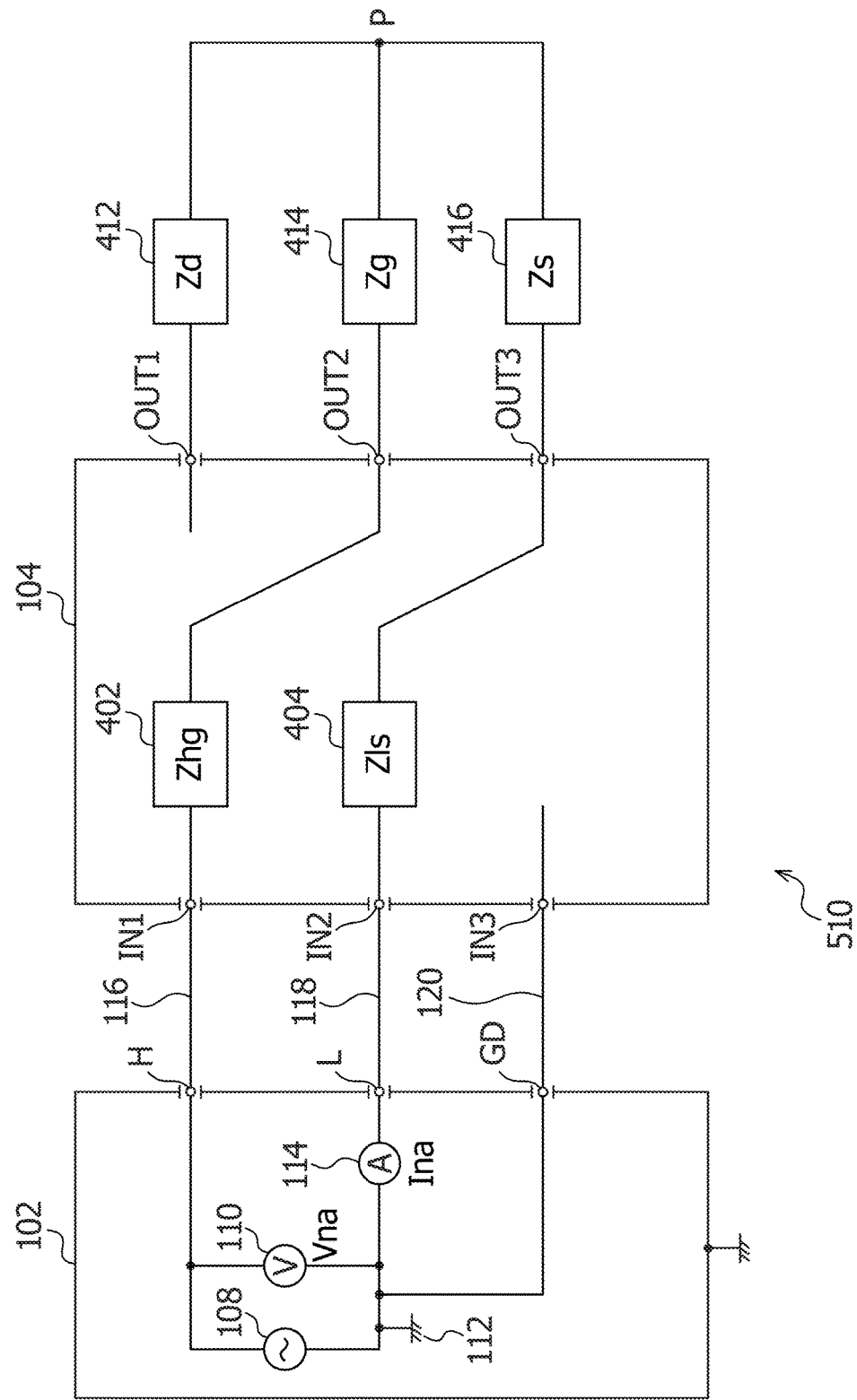
FIG. 5A is a diagram illustrating an equivalent circuit in the first route connection in Step 304 of the flowchart of FIG. 4.
Figure 5B:
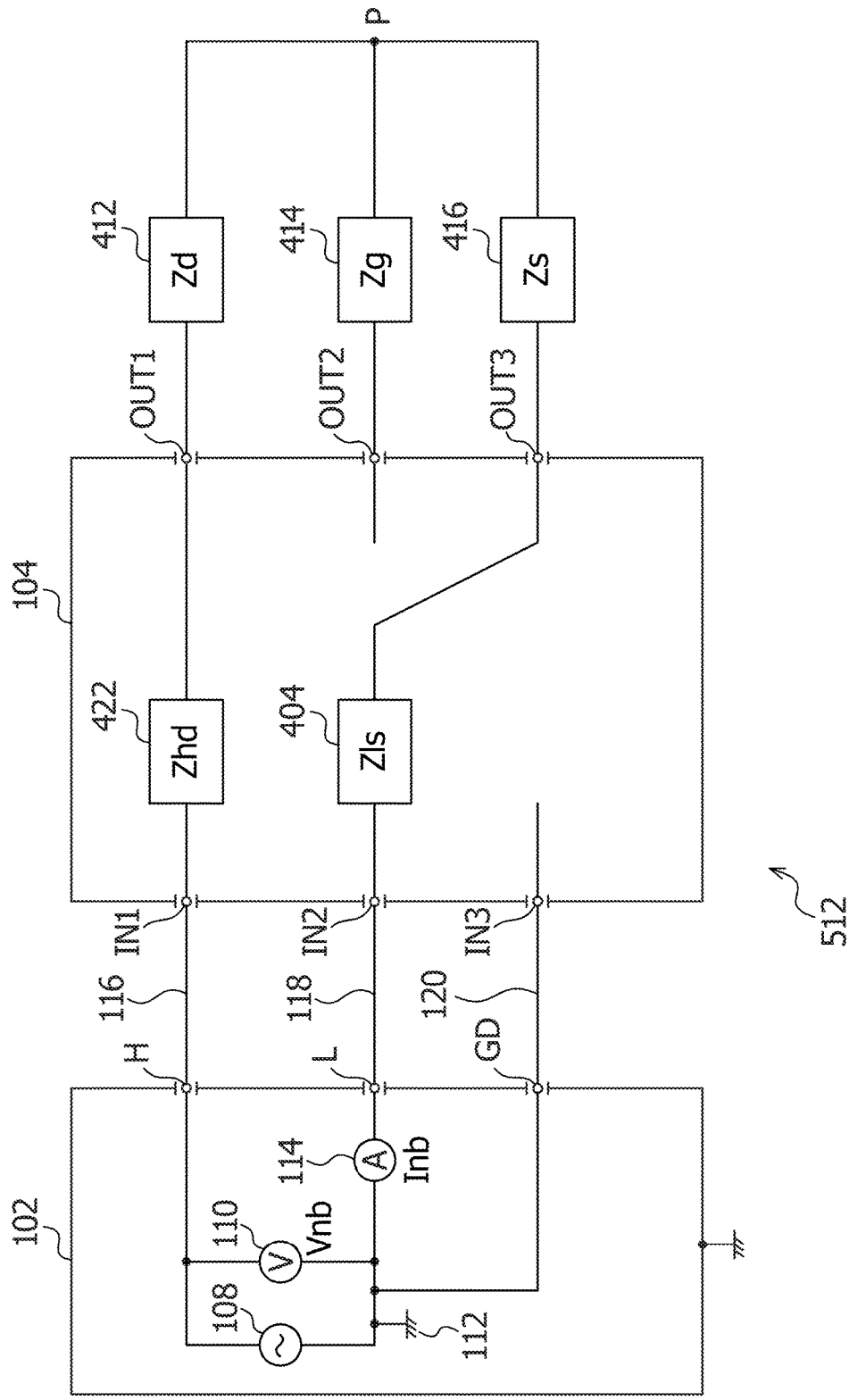
Figure 5C:
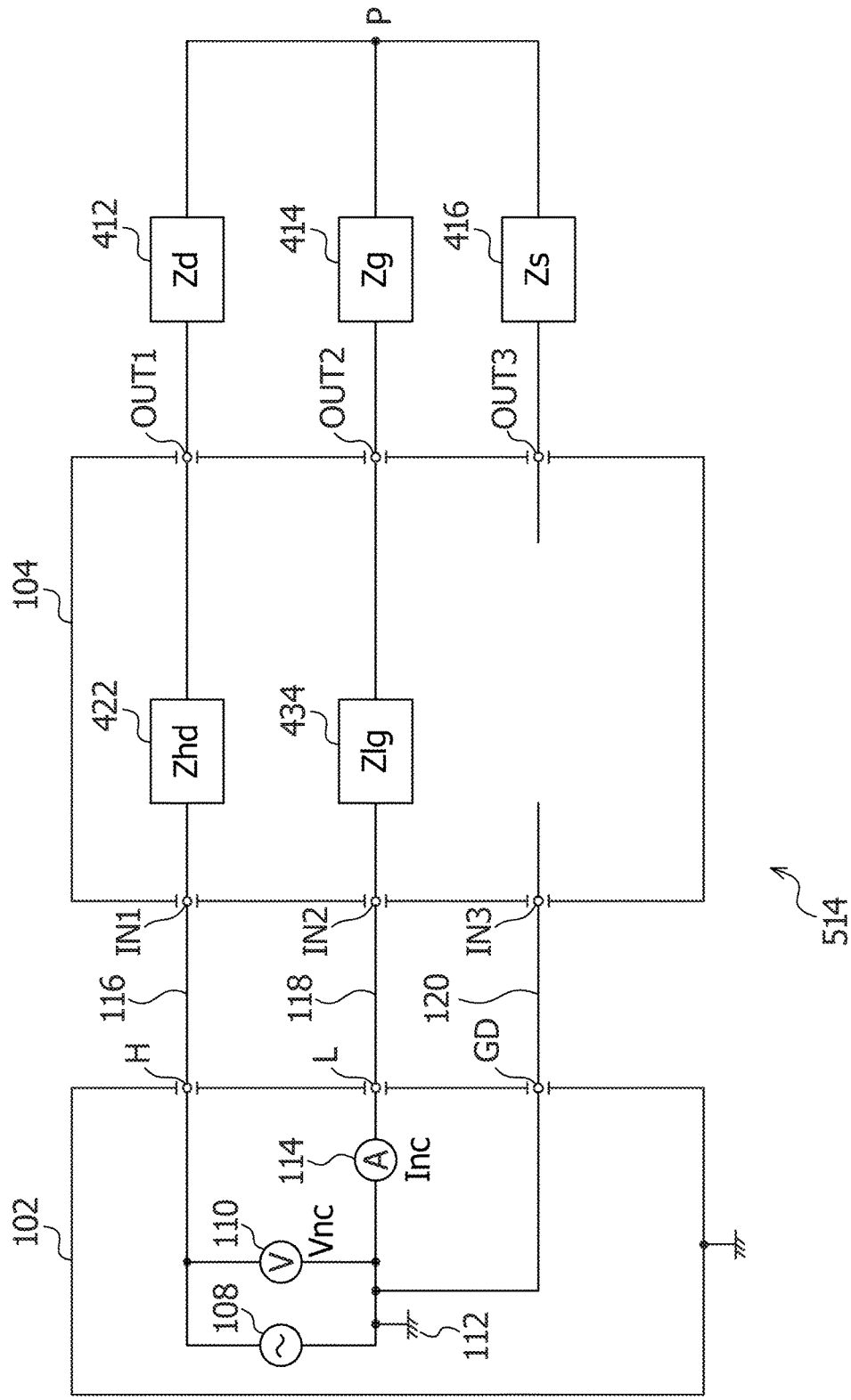

FIG. 5C is a diagram illustrating an equivalent circuit in the third route connection in Step 304 of the flowchart of FIG. 4.

Figure 6:
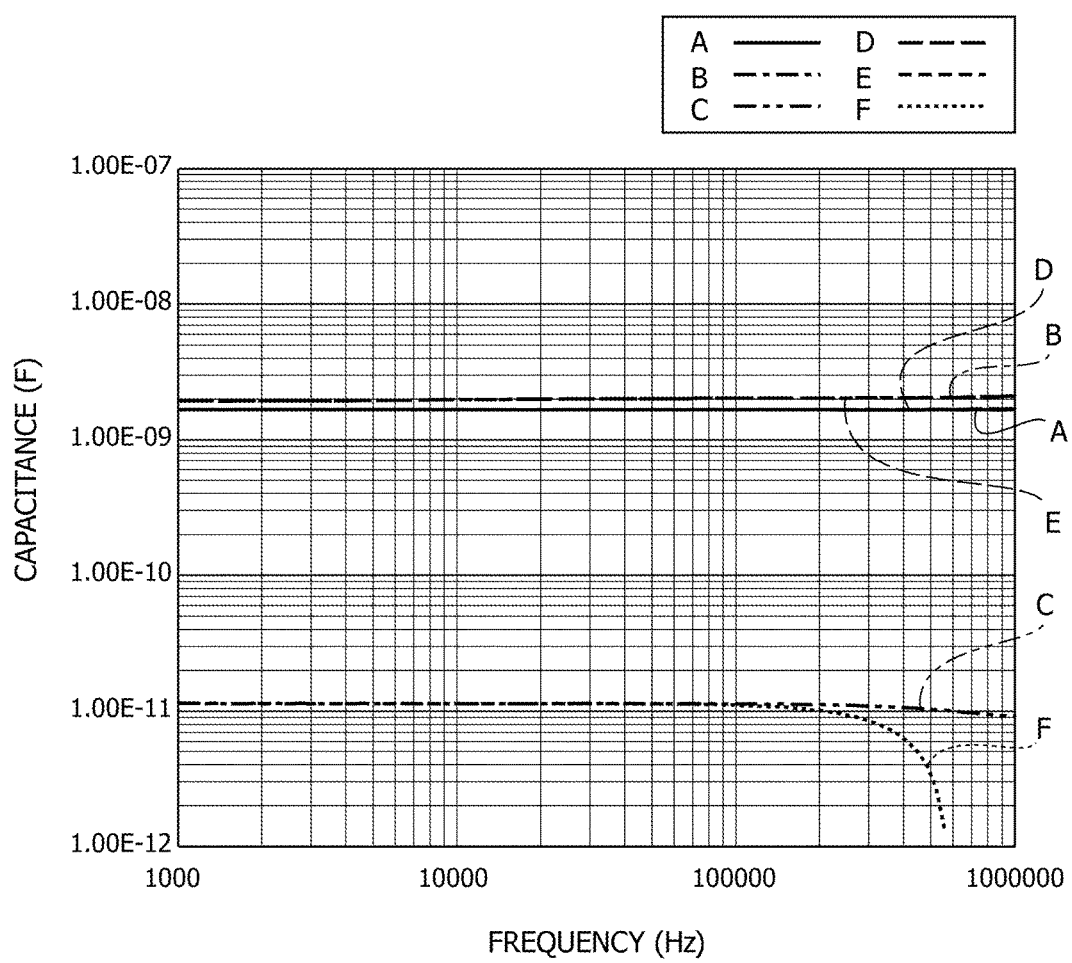

FIG. 6 is a graph showing an example of an effect when the measurement method of FIG. 4 is carried out on an actual device.

Figure 7:
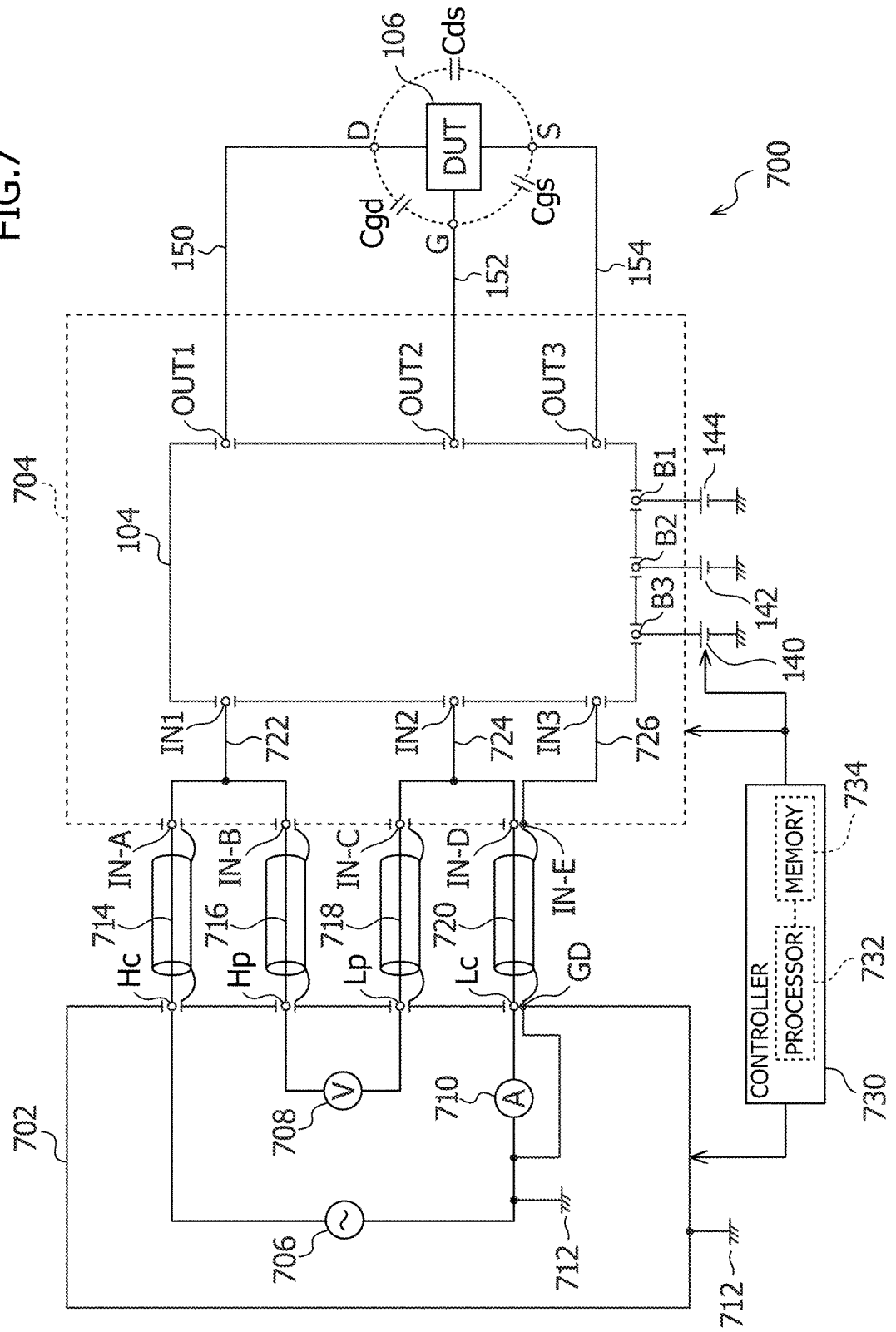

FIG. 7 is a block diagram illustrating a measurement apparatus according to a second embodiment of the present invention.

Figure 8:
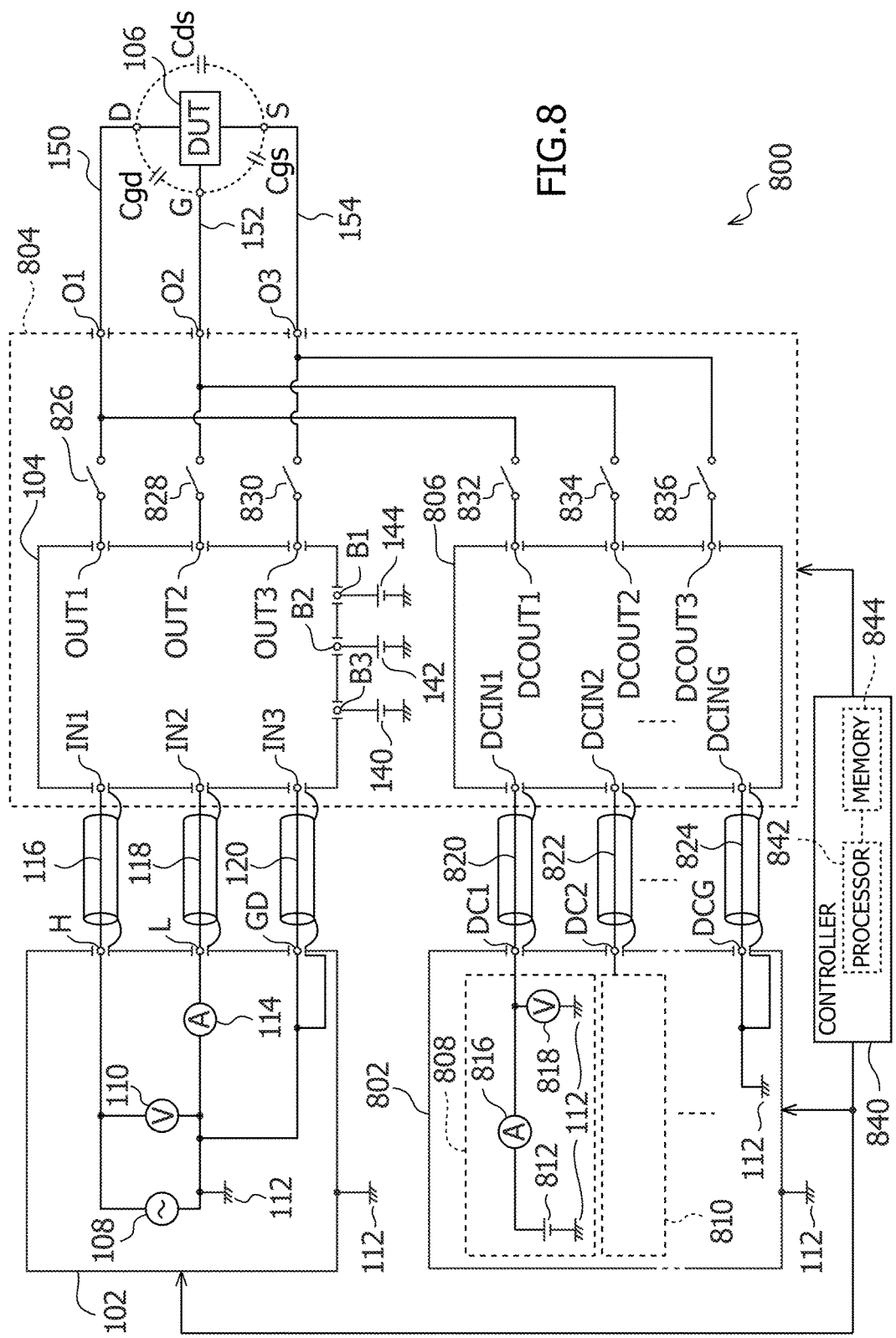

FIG. 8 is a block diagram illustrating a measurement apparatus according to a third embodiment of the present invention.

Figure 9:
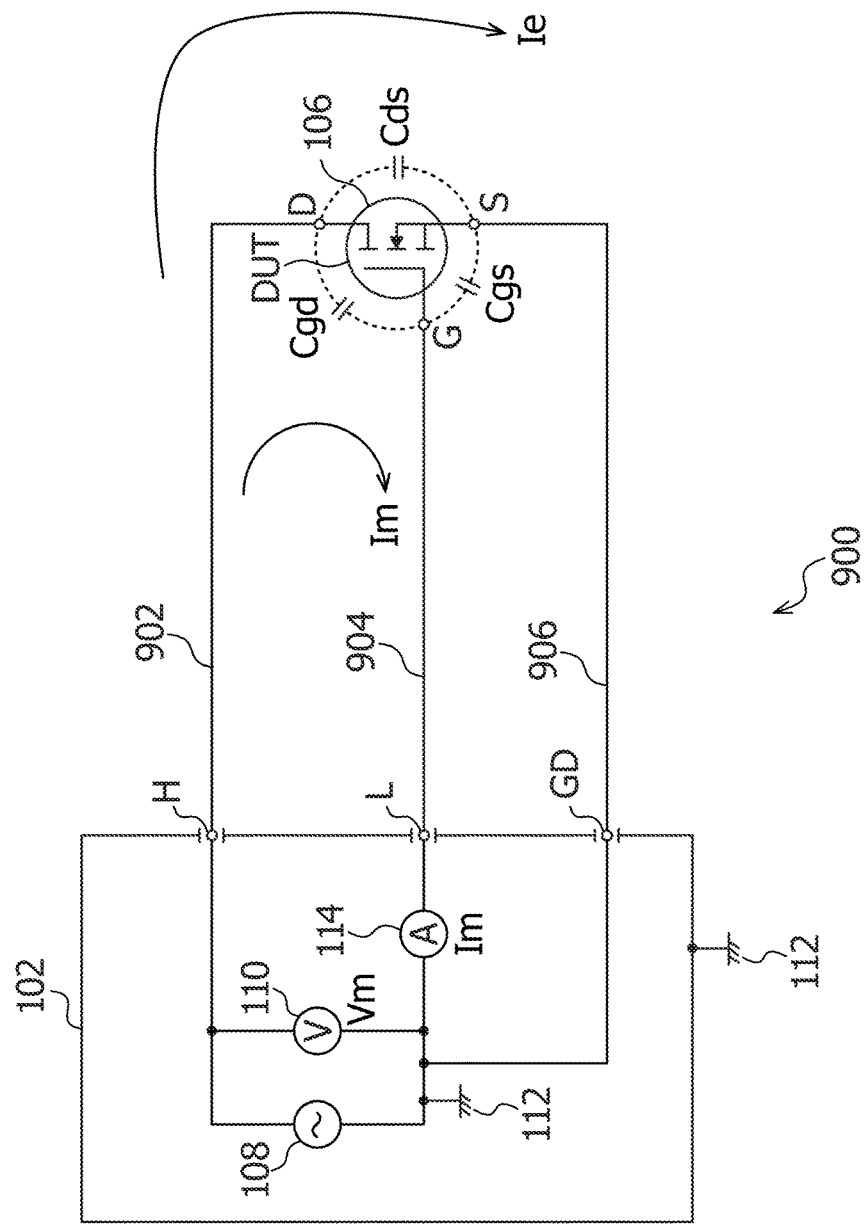

FIG. 9 is a block diagram illustrating a capacitance measurement apparatus for an FET using an AC guard according to related art.

Figure 10:
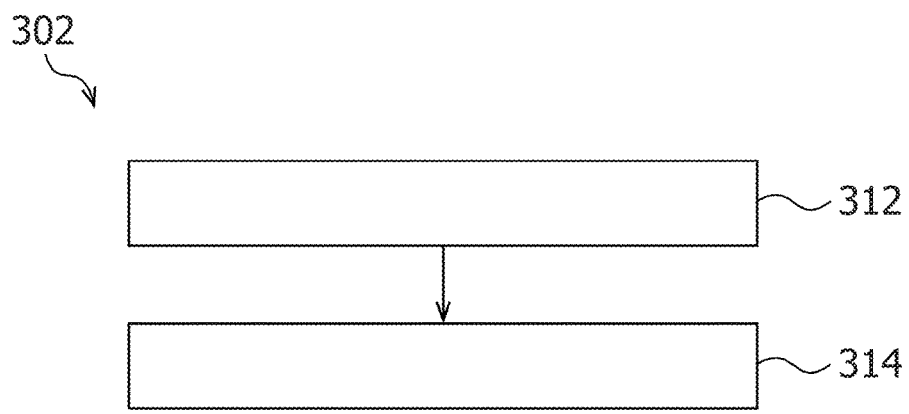

FIG. 10 is a flowchart illustrating Step 302 of FIG. 4.

Figure 11:
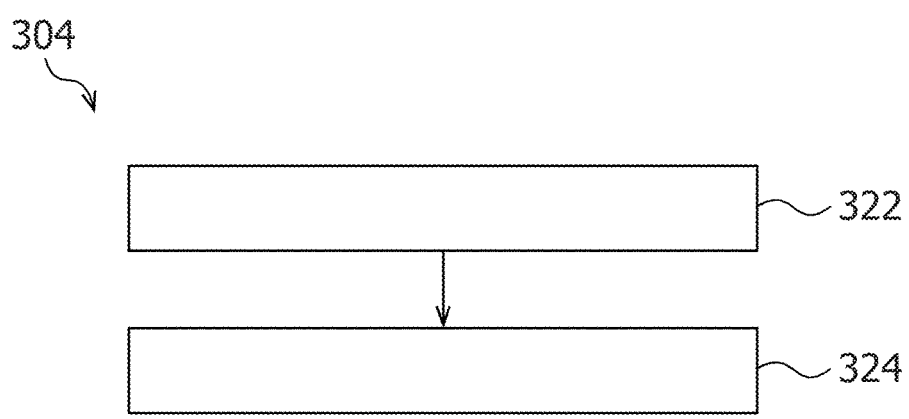

FIG. 11 is a flowchart illustrating Step 304 of FIG. 4.

Figure 12:
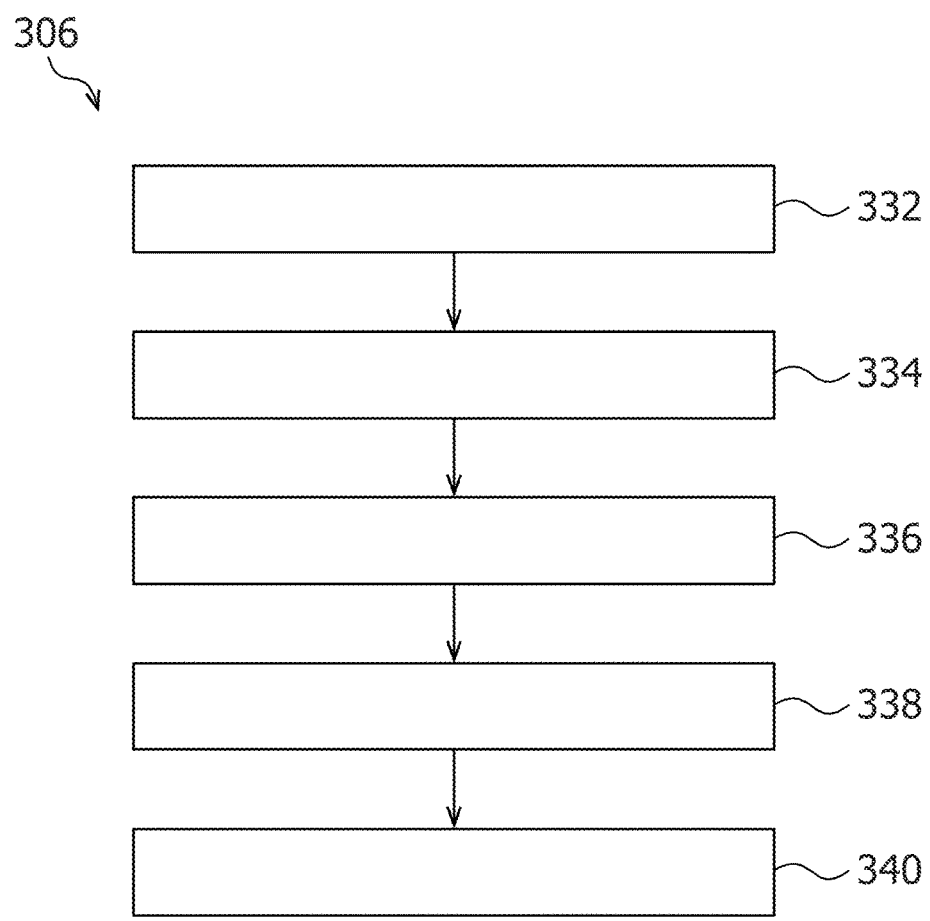

FIG. 12 is a flowchart illustrating Step 306 of FIG. 4.

DETAILED DESCRIPTION

The inventors of the present invention considered the above-mentioned problem, and discovered the following. Specifically, a measurement apparatus and a measurement method capable of highly precisely acquiring three inter-terminal capacitances can be provided by providing a route selector capable of superimposing DC voltages between an LCR meter and a DUT in order to apply high voltages on respective terminals, which is difficult for related art, to measure the inter-terminal capacitances of a three-terminal device in a reproducible manner, thereby enabling connections via various routes between respective terminals of the LCR meter and the DUT without a manual operation, and moreover by enabling the superimposition of DC voltages higher than related-art voltages, and by devising a measurement method in order to cancel inductance components on routes to the DUT, namely, residual inductances, which become apparent when the route selector is interposed. This knowledge has led the inventors of the present invention to devise the present invention.

Figure 1:
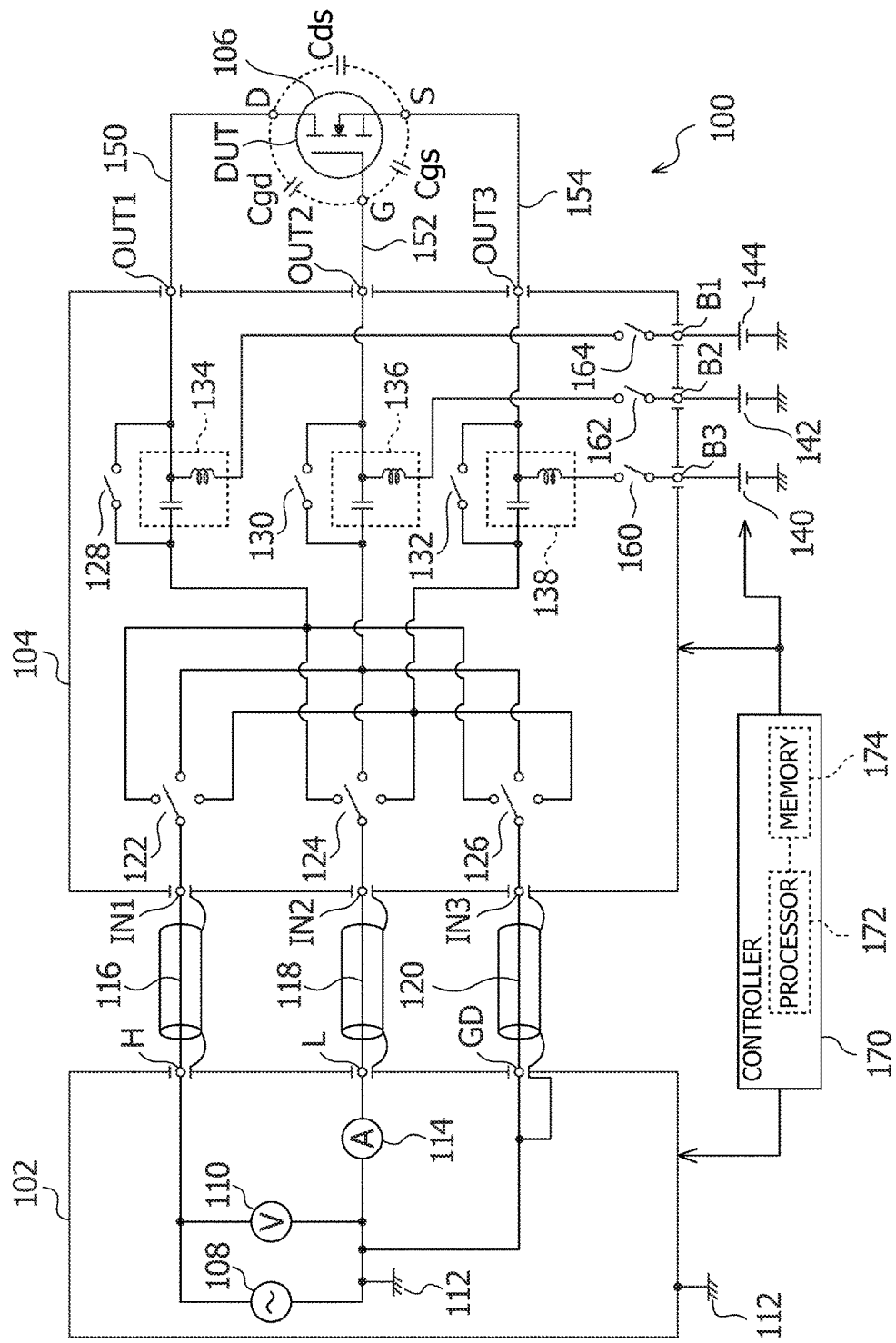
FIG. 1 is a block diagram illustrating a measurement apparatus according to a first embodiment of the present invention.

FIG. 1 illustrates a measurement apparatus 100 according to a first embodiment of the present invention. It should be noted that, in the following description of the drawings, the same reference numerals are assigned to the same components as those already described.

In FIG. 1, an LCR meter 102 and a DUT 106, which is a three-terminal device exemplified as an FET, are the same as those of FIG. 9, and a description thereof is therefore omitted. In a route selector 104, terminals OUT1, OUT2, and OUT3 representing core cables of coaxial connectors can be connected to any of terminals IN1, IN2, and IN3 representing core cables of coaxial connectors by relays 122, 124, and 126 of the route selector 104.

Between the relays 122 to 126 and the terminal OUT1, a bias tee 134 and a bypass relay 128 thereof are provided, and a voltage of a DC power supply 144 connected to a terminal B1 can be superimposed as a bias voltage on the terminal OUT1 by opening the bypass relay 128 and closing a DC separation relay 164. Moreover, the superimposition of the bias voltage of the DC power supply 144 on the terminal OUT 1 is disabled by closing the bypass relay 128 and opening the DC separation relay 164.

The same configuration is provided as a bias tee 136 and a bypass relay 130 thereof between the relays 122 to 126 and the terminal OUT2, further, as a DC separation relay 162 provided between the bias tee 136 and a terminal B2, and as a DC power supply 142 connected to the terminal B2.

Furthermore, the same configuration is provided as a bias tee 138 and a bypass relay 132 thereof between the relays 122 to 126 and the terminal OUT3, further, as a DC separation relay 160 provided between the bias tee 138 and a terminal B3, and as a DC power supply 140 connected to the terminal B3.

A high-side terminal H of the LCR meter and the terminal IN1 of the route selector are connected to each other via a coaxial cable 116, a low-side terminal L and the terminal IN2 of the route selector are connected to each other via a coaxial cable 118, and a guard terminal GD and the terminal IN3 of the route selector are connected to each other via a coaxial cable 120.

Furthermore, the terminal OUT1 of the route selector and a D terminal of the DUT 106 are connected to each other via a cable 150, and the terminal OUT2 and a G terminal are connected to each other via a cable 152, and the terminal OUT3 and an S terminal are connected to each other via a cable 154.

Furthermore, the measurement apparatus 100 includes a controller 170 incorporating a processor 172 and a memory 174 connected to the processor 172. The controller 170 controls the LCR meter 102, the route selector 104, and the DC power supplies 140, 142, and 144.

On this occasion, a controller on which Agilent B1505A is installed can be used as the controller 170. Moreover, the controller 170 can be a computer on which a Windows (registered trademark)-based OS from Microsoft Corporation is installed, a computer on which another type of OS is installed, or a controller constructed by a dedicated IC, such as an ASIC or an FPGA, or a general-purpose IC.

On this occasion, for the processor 172, a commercially available microprocessor, an embedded processor, an application specific integrated circuit (ASIC), a programmable logic device (PLD), or a field-programmable gate array (FPGA) can be used, but the processor 172 is not limited thereto. The memory 174 may include a read-only memory (ROM), an erasable programmable read-only memory (EPROM), an electrically erasable programmable read-only memory (EEPROM), a random access memory (RAM), a flash memory, and other nonvolatile memories or volatile memories, but is not limited thereto. The memory 174 may be further configured to include a hard disk drive, or an optical drive using an optical medium such as a CD or DVD. The memory 174 can store computer programs executed by the processor 172 and data used by the programs, and any of methods described herein can be executed by the processor 172.

Thus, when measurement is carried out on the LCR meter 102, the measurement apparatus 100 can superimpose voltages applied to the DC power supplies 140, 142, and 144 on the terminals OUT1 to OUT3 as bias voltages. It should be noted that, in the measurement apparatus 100, when the bias voltages are superimposed, bias power supplies (not shown) built into the LCR meter 102 can be used in addition to the DC power supplies 140 to 144.

As the LCR meter 102, for example, a commercially available LCR meter such as 4294A or E4980A from Agilent Technologies, Inc. can be used.

Figure 2:
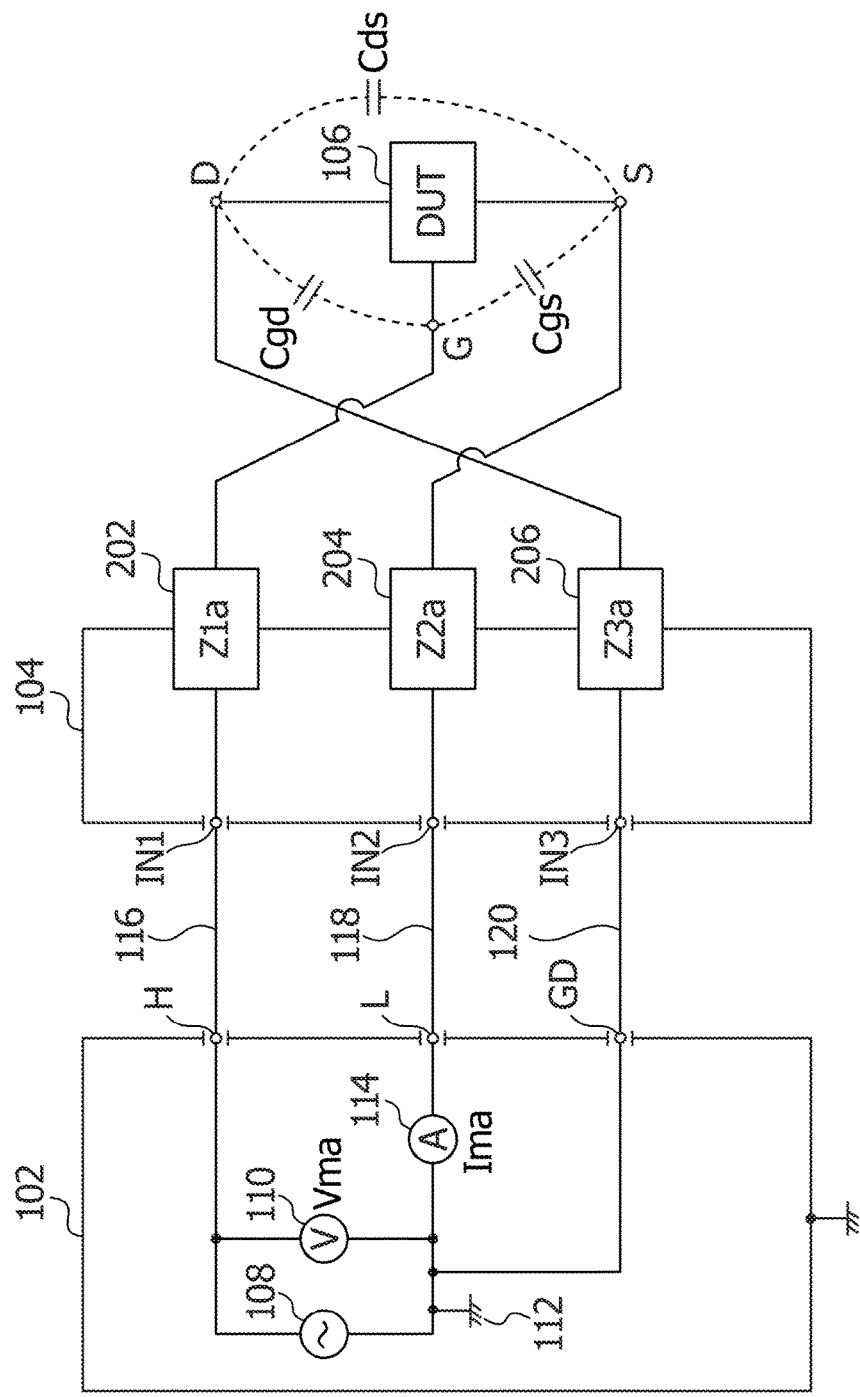
FIG. 2 is a diagram illustrating an equivalent circuit in an example of measurement on the apparatus of FIG. 1.

Referring to FIG. 2, a description is now given of an equivalent circuit of FIG. 1 as an example of the connection to the DUT by using the apparatus of FIG. 1.

Figure 3A:
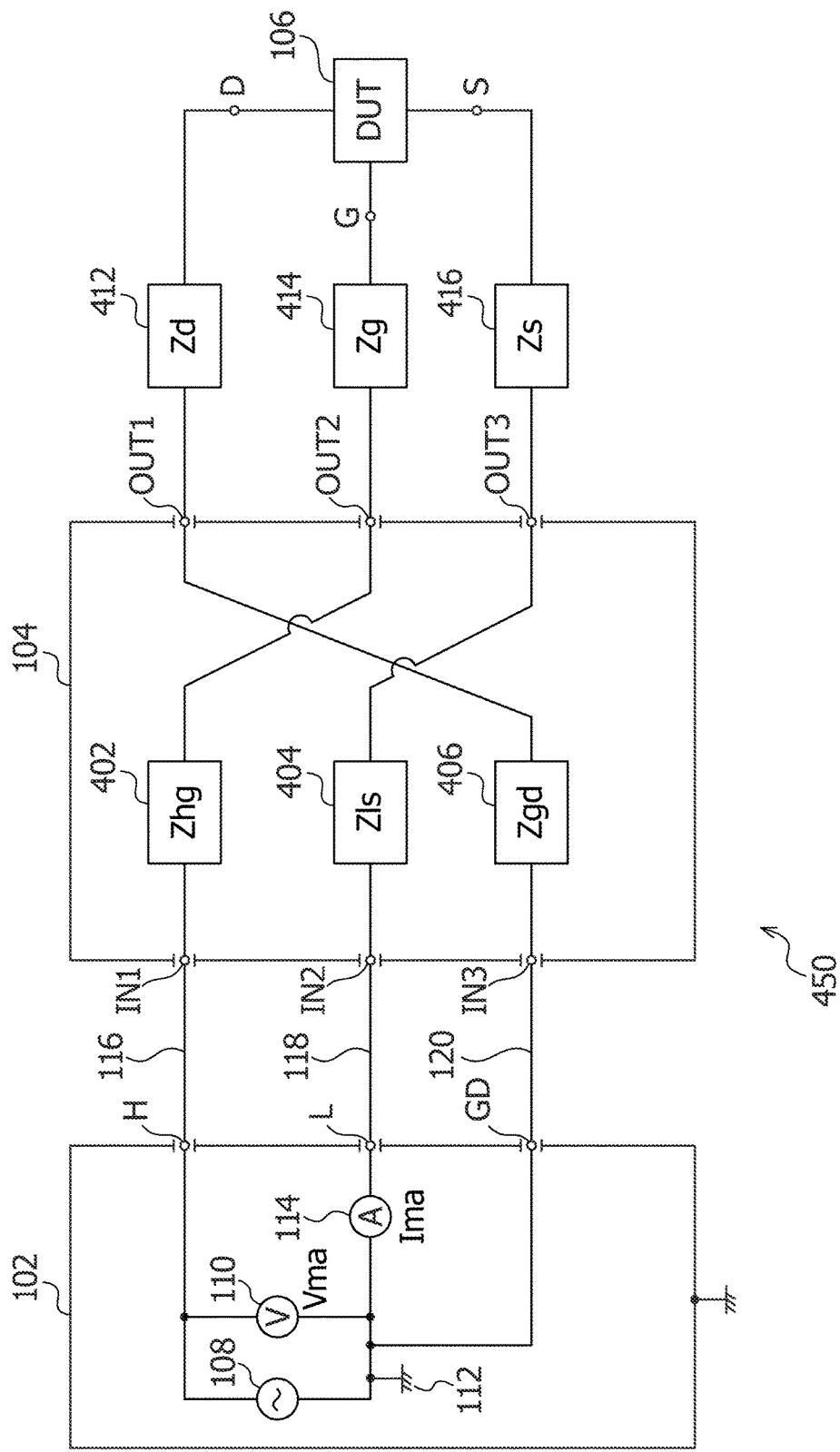
FIG. 3A is a diagram illustrating an equivalent circuit when a route selector 104 is in a first route connection in FIG. 1.
Figure 3B:
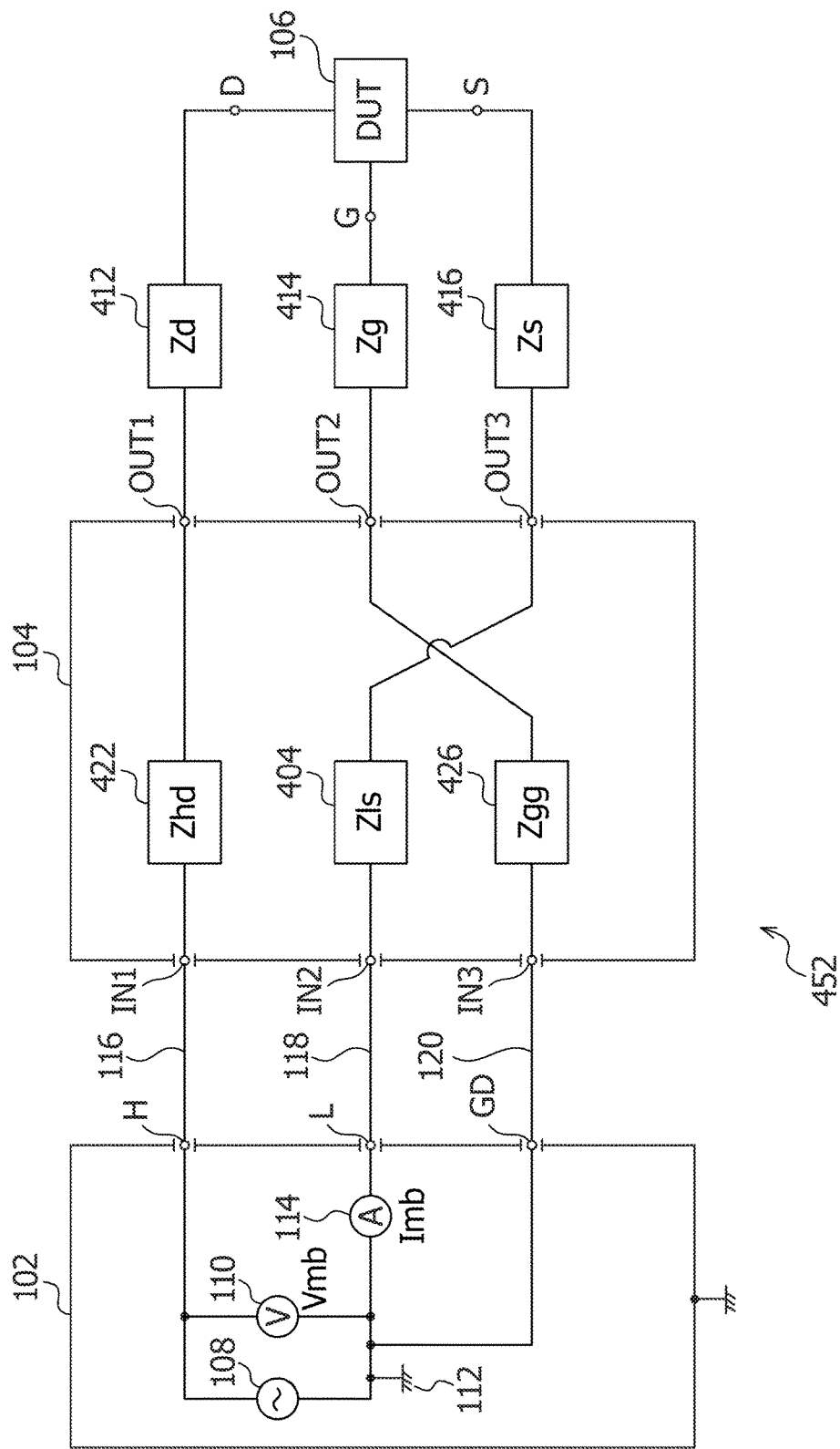
FIG. 3B is a diagram illustrating an equivalent circuit when the route selector 104 is in a second route connection in FIG. 1.
Figure 3C:
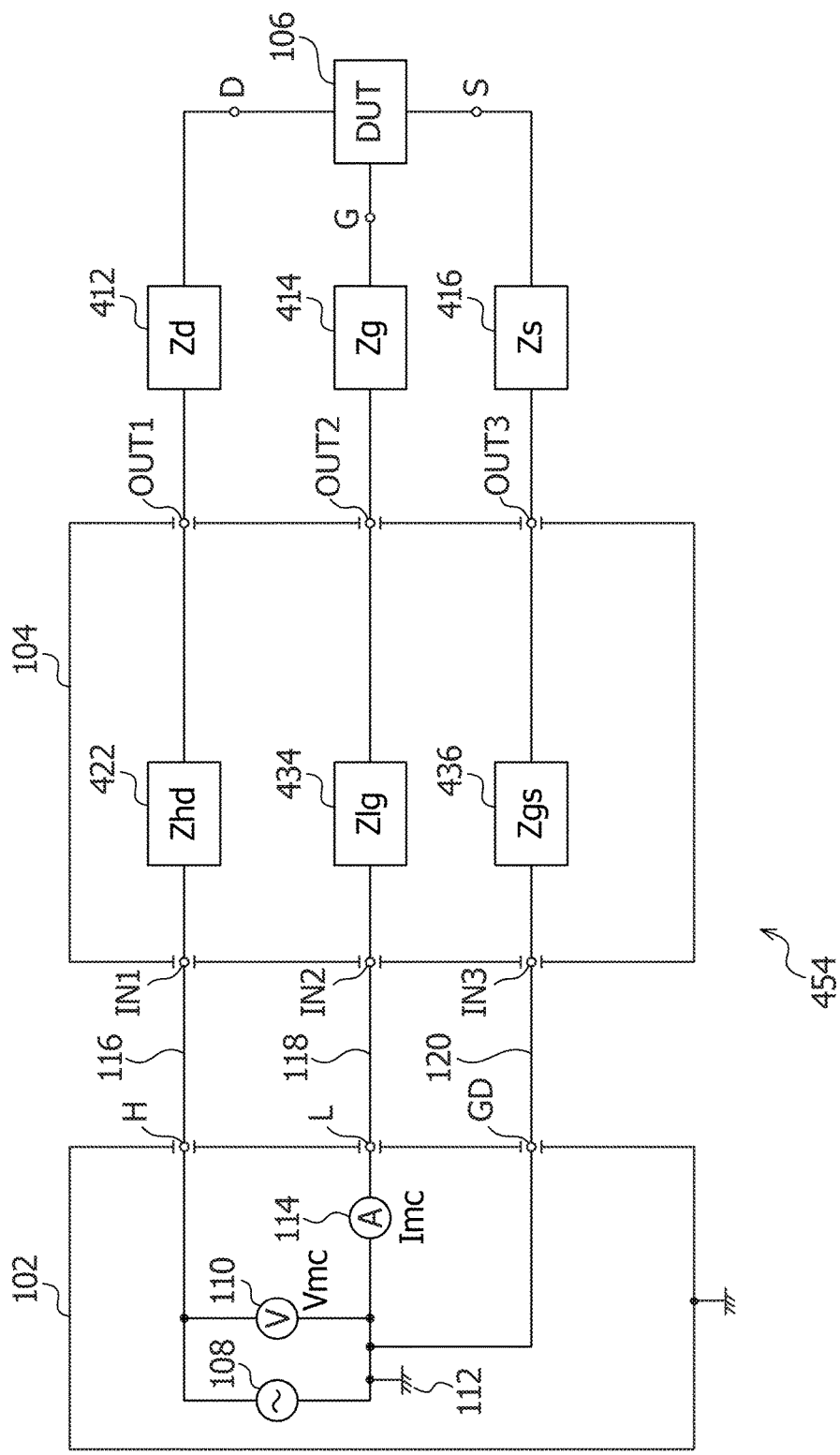
FIG. 3C is a diagram illustrating an equivalent circuit when the route selector 104 is in a third route connection in FIG. 1.

It should be noted that in FIGS. 2, 4, and 5, connections relating to the controller 170 and outer conductors of the coaxial cables 116, 118, and 120 are omitted from the illustration for the sake of simplicity of the illustration. Circuit symbols of the DUT 106 are not shown in FIG. 2 and thereafter, and in FIGS. 3A to 3C, illustrations of the inter-terminal capacitances of the DUT 106 are also omitted.

Incidentally, in FIG. 9, if the cables 902 to 906 are so short that the inductances of the respective cables can be neglected, the capacitance Cgd can be precisely measured from the measurement values of the ammeter 114 and the voltmeter 110. However, as illustrated in FIG. 1, if the automated route selector 104 is provided between the LCR meter 102 and the DUT 106, the route lengths increase. As a result, the inductances on the routes cannot be neglected any longer, and the inter-terminal capacitances cannot be accurately measured unless influences of the inductances are taken into account. Thus, in the following, the equivalent circuit of the apparatus of FIG. 1 is considered while the impedances of the routes are taken into account.

FIG. 2 illustrates an equivalent circuit for a case in which, in FIG. 1, the terminal IN1 of the route selector is connected to the terminal G of the DUT 106, the terminal IN2 is connected to the terminal S, and the terminal IN3 is connected to the terminal D. On this occasion, the route impedance from the terminal IN1 of the route selector to the terminal G of the DUT 106 is denoted by $Z1a$, the route impedance from the terminal IN2 to the terminal S is denoted by $Z2a$, and the mute impedance from the terminal IN3 to the terminal D is denoted by $Z3a$. In this case, an impedance Zma viewed from the LCR meter can be acquired as:

$$Zma = Vma/Ima \quad (1)$$

where Vma is the measurement value of the voltmeter 110 of the LCR meter 102, and Ima is the measurement value of the ammeter.

Similarly, in FIG. 1, when the terminal IN1 of the route selector is connected to the terminal D of the DUT 106, the terminal IN2 is connected to the terminal S, and the terminal IN3 is connected to the terminal G, an impedance Zmb viewed from the LCR meter can be acquired by:

$$Zmb = Vmb/Imb \quad (2)$$

where $Z1b$ is a route impedance from the terminal IN1 to the terminal D, $Z2b$ is a route impedance from the terminal IN2 to the terminal S, $Z3b$ is a route impedance from the terminal IN3 to the terminal G, Vmb is a measurement value of the voltmeter 110 of the LCR meter 102, and Imb is a measurement value of the ammeter.

Similarly, in FIG. 1, when the terminal IN1 of the route selector is connected to the terminal D of the DUT 106, the terminal N2 is connected to the terminal G, and the terminal IN3 is connected to the terminal S, an impedance Zmc viewed from the LCR meter can be acquired by:

$$Zmc = Vmc/Imc \quad (3)$$

where $Z1c$ is a route impedance from the terminal IN1 to the terminal D, $Z2c$ is a route impedance from the terminal TN2 to the terminal G, $Z3c$ is a route impedance from the terminal IN3 to the terminal S, Vmc is a measurement value of the voltmeter 110 of the LCR meter 102, and Imc is a measurement value of the ammeter.

Furthermore, a relationship between the three inter-terminal capacitances Cgs, Cds, and Cgd of the DUT 106 and the corresponding impedances Zgs, Zds, and Zgd can be represented by a set of equations of Equation (4).

$$Cgs = -1/(j\omega Zgs)$$

$$Cds = -1/(j\omega Zds)$$

$$Cgd = -1/(j\omega Zgd) \quad (4).$$

Referring to FIGS. 3A to 3C, a more detailed description is now given of the three connections described with reference to FIG. 2 as the example. First, in FIG. 3A, the impedances $Z1a$, $Z2a$, and $Z3a$ of FIG. 2 are decomposed into impedances from the terminals H, L and GD of the LCR meter to the terminals OUT1, OUT2, and OUT3 of the route selector, and impedances from the terminals OUT1, OUT2, and OUT3 of the route selector to the DUT. Furthermore, in FIG. 3B, the impedances $Z1b$, $Z2b$, and $Z3b$ of FIG. 2 are decomposed into impedances from the terminals H, L, and GD of the LCR meter to the terminals OUT1, OUT2, and OUT3 of the route selector, and impedances from the terminals OUT1, OUT2, and OUT3 of the route selector to the DUT. Furthermore, in FIG. 3C, the impedances Z1c, Z2c, and Z3c of FIG. 2 are decomposed into impedances from the terminals H, L, and GD of the LCR meter to the terminals OUT1, OUT2, and OUT3 of the route selector, and impedances from the terminals OUT1, OUT2, and OUT3 of the route selector to the DUT. Thus, the above-mentioned impedances Z1a to Z1c, Z2a to Z2c, and Z3a to Z3c of FIGS. 3A to 3C can be represented as three sets of equations expressed by Equations (5) to (7).

In other words, in FIG. 3A, $$Z1a = Zhg + Zg$$

$$Z2a = Zls + Zs$$

$$Z3a = Zgd + Zd \qquad (5),$$

in FIG. 3B, $$Z1b = Zhd + Zd$$

$$Z2b = Zls + Zs$$

$$Z3b = Zgg + Zg \qquad (6),$$

and in FIG. 3C, $$Z1c = Zhd + Zd$$

$$Z2c = Zlg + Zg$$

$$Z3c = Zgs + Zs \qquad (7).$$

Three simultaneous equations expressed by Equation (8) can be acquired by applying the Kirchhoff's laws to the three connections in FIGS. 3A to 3C.

$$((Zma-Z1a-Z2a) \cdot Z3a - Z1a - Z2a) \cdot (Zgs+Zd+Zgd) - (Z1a+Z3a)Zgs \cdot Zds + (Zma-Z1a-Z2a) \cdot Zds \cdot Zgd - (Z2a+Z3a) \cdot Zgd \cdot Zgs - Zgs \cdot Zds \cdot Zgd = 0((Zmb-Z1b-Z2b) \cdot Z3b - Z1b \cdot Z2b) \cdot (Zds+Zgs+Zgd) - (Z1b+Z3b) \cdot Zds \cdot Zgs + (Zmb-Z1b-Z2b) \cdot Zgs \cdot Zgd - (Z2b+Z3b) \cdot Zgd \cdot Zds - Zds \cdot Zgs \cdot Zgd = 0((Zmc-Z1c-Z2c) \cdot Z3c - Z1c \cdot Z2c) \cdot (Zgd+Zgs+Zds) - (Z1c+Z3c) \cdot Zgd \cdot Zgs + (Zmc-Z1c-Z2c) \cdot Zgs \cdot Zds - (Z2c+Z3c) \cdot Zds \cdot Zgd - Zyd \cdot Zgs \cdot Zds = 0 \qquad (8)$$

From the above-mentioned consideration, the inventors of the present invention acquired the following knowledge. Specifically, in the circuit of FIG. 1, when the LCR meter is used to measure the inter-terminal capacitances of a three-terminal device, such an operation that two terminals for which the capacitance needs to be measured out of the three terminals of the device are connected to the high-side and low-side terminals of the LCR meter, and the remaining one terminal is connected to the guard terminal, to thereby measure the capacitance, needs to be carried out for the three sets of connections for the three terminals of the device. Furthermore, those three sets of connections are three sets of connections that are the same in the topology and different only in the connected terminals, and hence the respective inter-terminal capacitances without the influences of the residual inductance components can be acquired by solving the simultaneous equations expressed by Equation (8) relating to the three sets of connections to combine the measurement results for the three sets of connections without directly and individually measuring the residual inductances for respective sections in the respective routes. Based on this knowledge, the inventors of the present invention came to devise a measurement method represented by the flowchart 300.

FIG. 4 illustrates the flowchart 300 of the measurement method for acquiring the three inter-terminal capacitances by using the measurement apparatus 100 of FIG. 1 while the residual inductances are cancelled.

In the flowchart 300, first, in Step 302, in the measurement apparatus 100 of FIG. 1, the measurement is carried out for the three connections in order to acquire the error impedances for the routes to the three terminals of the DUT 106.

Then, in Step 304, the measurement apparatus 100 of FIG. 1 is used to carry out the measurement for the three connections with respect to the DUT 106 in order to acquire the impedances of the respective inter-terminal capacitances including the errors of the residual inductances.

Furthermore, in Step 306, the respective inter-terminal capacitances of the DUT 106 for which the influences of the residual inductances are cancelled are acquired from the measurement results in Steps 302 and 304.

As a result, the inter-terminal capacitances for which the residual inductances of the routes from the DUT to the respective terminals are canceled can be acquired.

It should be noted that Steps 302 and 304 can be carried out in a reversed order. Furthermore, when a plurality of DUTs exist, Steps 304 and 306 can be repeated by a plurality of times.

Now, referring to FIG. 10, a detailed description is given of Step 302, referring to FIG. 11, a detailed description is given of Step 304, and, referring to FIG. 12, a detailed description is given of Step 306.

In FIG. 10, Step 302 is carried out as Steps 312 and 314.

First, in Step 312, in the connection of FIG. 1, the terminals of the cables 150, 152, and 154 that are not connected to the route selector 104 are short-circuited to one another. A point of the short circuit is denoted as a point p (for example, refer to FIG. 5A). In other words, in the connection of FIG. 1, the DUT 106 is removed, and the terminals of the respective cables are short-circuited.

Then, in Step 314, the connection of FIG. 5A is formed, and a voltage Vna and a current Ina are measured by the voltmeter 110 and the ammeter 114. Then, a connection of FIG. 5B is formed, and a voltage Vnb and a current Inb are measured in the same way. Then, a connection of FIG. 5C is formed, and a voltage Vnc and a current Inc are measured in the same way.

Then, in FIG. 11, Step 304 is carried out as Steps 322 and 324.

First, in Step 322, the terminals of the cables 150 to 154 that are not connected to the route selector 104 are respectively fixed to the terminals D, G, and S of the DUT.

Then, in Step 324, the connection of FIG. 3A is formed, and in the LCR meter 102, a voltage Vma and a current Ima are measured by the voltmeter 110 and the ammeter 114. Then, a connection of FIG. 3B is formed, and a voltage Vmb and a current Imb are measured in the same way. Then, a connection of FIG. 3C is formed, and a voltage Vmc and a current Imc are measured in the same way.

Then, in FIG. 12, Step 306 is carried out as Steps 332, 334, 336, 338, and 340.

First, in Step 332, the impedances Zna, Znb, and Znc are acquired by using the set of equations expressed by Equation (9) from the measurement result in Step 314.

$$Zna = Vna/Ina$$

$$Znb = Vnb/Inb$$

$$Znc = Vnc/Inc \qquad (9).$$

On this occasion, based on FIGS. 5A to 5C, the above-mentioned impedances Zna to Znc can be represented by a set of equations expressed by Equation (10).

$$Zna=Zg+Zs+Zhg+Zls$$

$$Znb=Zd+Zs+Zhd+Zls$$

$$Znc=Zd+Zg+Zhd+Zlg \quad (10).$$

It should be noted that, in Equation (10), the impedances Zhg, Zls, Zhd, and Zlg of the routes in the route selector are known values that are measured in advance or available as design values.

Thus, a set of equations expressed by Equation (11) can be acquired by assigning Equation (10) to Equation (9), and solving in terms of Zd, Zg, and Zs.

$$Zd=(-3*Zna+Znb+Znc-2*Zhd+2*Zls+3*Zhg-Zlg)/2$$

$$Zg=(Zna-3*Znb+Znc+2*Zhd+2*Zls-Zhg-Zlg)/2$$

$$Zs=(Zna+Znb-3*Znc+2*Zhd-2*Zls-Zhg+3*Zlg)/2 \quad (11).$$

Thus, in Step 334, the impedances Zd, Zg, and Zs of the cables 150 to 154 are acquired based on Equation (11).

Furthermore, in Step 336, the impedances Z1a to Z1c, Z2a to Z2c, and Z3a to Z3c are acquired based on Equations (5) to (7).

Then, in Step 338, the impedances Zma to Zmc are acquired from the measurement result in Step 324 based on Equations (1) to (3). It should be noted that Zma to Zmc are impedances for which the inductances of the routes are not canceled, and which thus include the errors.

Furthermore, in Step 340, the above-mentioned parameters are assigned to Equation (8) to acquire the impedances Zgs, Zds, and Zgd through the numerical analysis method, and the three inter-terminal capacitances Cgs, Cds, and Cgd of the DUT 106 are acquired based on Equation (4).

As a result of the processing described above, the three inter-terminal capacitances Cgs, Cds, and Cgd of the DUT 106 are acquired while the inductances of the routes are cancelled by following the flowchart 300.

It should be noted that, as the numerical analysis method in Step 340, various analysis methods such as the simplex method of linear programming may be used.

As an example of the effect of cancelling the residual inductances according to the first embodiment of the present invention, FIG. 6 shows the inter-terminal capacitances Cgs, Cds, and Cgd that were acquired by connecting a power MOS FET, IPW60R199CP from Infineon technologies AG as the DUT 106, and following the measurement method according to the first embodiment. FIG. 6 also shows a result of a case in which the connections in FIGS. 3A to 3C were formed to simply measure the capacitances Cgs, Cds, and Cgd by the LCR meter 102. In FIG. 6, a line A represents Cgs after the residual inductances are cancelled, a line B represents Cds after the residual inductances are cancelled, a line C represents Cgd after the residual inductances are cancelled, a line D represents Cgs when the residual inductances are not cancelled, a line E represents Cds when the residual inductances are not cancelled, and a line F represents Cgd when the residual inductances are not cancelled. It should be noted that, as the LCR meter 102, B1502A MFCMU on which B1505A from Agilent Technology, Inc. is installed was used.

As shown in the graph of FIG. 6, for the capacitance Cgd, the effect of the cancel according to the present invention appears at a frequency equal to or more than 44 kHz. It should be noted that the effect of the cancel appears at a frequency equal to or more than 453 kHz for the capacitance Cds, and the effect of the cancel appears at a frequency equal to or more than 563 kHz for the capacitance Cgs, which are difficult to appreciate from the graph.

Referring to FIG. 7, a description is now given of a measurement apparatus 700 according to a second embodiment of the present invention. The measurement apparatus 700 is different from that of the first embodiment of FIG. 1 in that an LCR meter of four-terminal connection is used for the LCR meter 702, a route selector 704 incorporating the route selector 104 according to the first embodiment and including a connection connector adapted to the LCR meter 702 is used as the route selector, and further, a controller 730 is a controller adapted to the LCR meter 702 and the route selector 704.

The LCR meter 702 includes an oscillator 706, a voltmeter 708, an ammeter 710, a ground point 712, a high-side current terminal Hc, a high-side voltage terminal Hp, a low-side voltage terminal Lp, a low-side current terminal Lc, and a guard terminal GD for outer conductors of coaxial connectors for those terminals.

The route selector 704 includes a terminal IN-A corresponding to the terminal Hc of the LCR meter, and a terminal IN-B corresponding to the terminal Hp, and the terminals IN-A and IN-B are connected to the terminal IN1 of the built-in route selector 104 via a cable 722. Furthermore, the route selector 704 includes a terminal IN-C corresponding to the terminal Lp of the LCR meter, and a terminal IN-D corresponding to the terminal Lc, and the terminals IN-C and IN-D are connected to the terminal IN2 of the built-in route selector 104 via a cable 724. Furthermore, the route selector 704 includes a terminal IN-E corresponding to the terminal GD of the LCR meter as the outer conductors of the coaxial connectors for the terminals IN-A to IN-D, and the terminal IN-E is connected to the terminal IN3 of the built-in route selector 104.

The terminal Hc of the LCR meter and the terminal IN-A of the route selector 704 are connected to each other via a coaxial cable 714. Similarly, the terminal Hp and the terminal IN-B are connected to each other via a coaxial cable 716, the terminal Lp and the terminal IN-C are connected to each other via a coaxial cable 718, the terminal Lc and the terminal IN-D are connected to each other via a coaxial cable 720, and the terminal GD and the terminal IN-E are connected to each other via the outer conductors of the coaxial cables 714 to 720.

The DC power supplies 144, 142, and 140 are connected from the outside of the route selector to the terminals B1, B2, and B3 of the route selector 104 built into the route selector 704.

The controller 730 includes a processor 732 and a memory 734 connected to the processor 732. The controller 730 controls the LCR meter 702, the route selector 704, and the built-in route selector 104, and further controls the DC power supplies 140 to 144. Configurations of the controller 730, the processor 732, and the memory 734 are the same as those in the description of the first embodiment.

The terminals OUT1 to OUT3 of the route selector 104 built into the route selector 704 are connected to the respective terminals of the DUT 106 via the cables 150 to 154, and those connections are the same as those of the first embodiment.

The route selector 704 of the second embodiment incorporates the route selector of the first embodiment, and is further the same in the connection to the DUT 106 as the first embodiment. Thus, when the LCR meter 702 and the route selector 704 are connected to each other as illustrated in FIG. 7, the connections between the built-in route selector 104 and the DUT 106 are the same as those of FIG. 1, and the connections of FIGS. 2, 3A to 3C, and 5A to 5C, and the methods illustrated in the flowcharts of FIG. 4, and 10 to 12 can be carried out in the same way by considering the measurement values of the voltage and the current of the voltmeter and the ammeter of the LCR meter 102 according to the first embodiment as the measurement values of the voltage and the current of the voltmeter and the ammeter of the LCR meter 702 according to the second embodiment. Thus, also in the second embodiment, the inter-terminal capacitances for which the residual inductances are cancelled can be acquired as in the first embodiment.

As described above, the second embodiment can provide the measurement apparatus and the measurement method for acquiring the inter-terminal capacitances for which the residual inductances are cancelled by using the LCR meter of the four-terminal connection.

Referring to FIG. 8, a description is now given of a measurement apparatus 800 according to a third embodiment of the present invention. The measurement apparatus 800 includes the LCR meter 102 of the three-terminal connection, a DC measurement apparatus 802, a route selector 804, and a DC route selector 806, and the route selector 804 is connected to the DUT 106.

The route selector 804 includes the route selector 104 according to the first embodiment, and the DC route selector 806 for the DC measurement apparatus 802, and includes such a configuration that one of the terminal OUT1 of the route selector 104 and a terminal DCOUT1 of the DC route selector can be connected to a terminal O1 via relays 826 and 832. The route selector 804 further includes such a configuration that one of the terminal OUT2 of the route selector 104 and a terminal DCOUT2 of the DC route selector can be connected to an terminal O2 via relays 828 and 834, and such a configuration that one of the terminal OUT3 of the route selector 104 and a terminal DCOUT3 of the DC route selector can be connected to a terminal O3 via relays 830 and 836. The terminals IN1, IN2, and IN3 of the route selector 104 in the route selector 804 are connected via the coaxial cables 116, 118, and 120 to the terminals H, L, and GD of the LCR meter 102 as in the first embodiment. The terminals B1 to B3 of the route selector 104, and the DC power supplies 144 to 140 are the same as those of the first embodiment. The LCR meter 102 is the same as that of the first embodiment.

The DC measurement apparatus 802 includes a plurality of channels of DC power supply modules 808 and 810, and as illustrated in the DC power supply module 808, applies a voltage from a DC voltage source 812 and includes a current measurement function using an ammeter 816 and a voltage measurement function using a voltmeter 818. The DC measurement apparatus 802 includes a plurality of terminals DC1, DC2, . . . corresponding to the plurality of built-in DC power supply modules 808 and 810, and a coaxial connector terminal DCG connected to the ground point 112. It should be noted that an outer conductor of the coaxial connector terminal DCG is used as a terminal for the DC guard connection. The DC route selector 806 includes a plurality of terminals DCIN1, DCIN2, . . . , DCING corresponding to the terminals DC1, DC2, . . . , DCG of the DC measurement apparatus 802, and are connected to the DC measurement apparatus 802 via the coaxial cables 820, 822, . . . , 824. It should be noted that the number of the plurality of terminals DC1, DC2, . . . , and the number of the plurality of terminals DCIN1, DCIN2, . . . do not always need to be limited to the same number. The DC route selector 806 includes a function of connecting any one of the terminals DCIN1, DCIN2, . . . , DCING to the terminals DCOUT1, DCOUT2, . . . , DCOUT3, and thus can have such a performance that even when a signal of a large current or a high voltage or a signal of a microcurrent or a microvoltage is supplied from the DC measurement apparatus, a problem such as a loss in terms of the measurement is not caused.

The terminals O1, O2, and O3 of the route selector 804 are connected to the terminals D, G, and S of the DUT 106 via the cables 150, 152, and 154.

The controller 840 includes a processor 842 and a memory 844 connected to the processor 842. The controller 840 controls the LCR meter 102, the DC measurement apparatus 802, and the route selector 804. It should be noted that the control of the route selector 804 includes control of the route selector 104, the DC route selector 806, and the DC power supplies 140 to 144. Configurations of the controller 840, the processor 842, and the memory 844 are the same as those in the description of the first embodiment.

The measurement apparatus 800 includes the configuration of the measurement apparatus 100, and the methods illustrated in FIGS. 1 to 5, and 10 to 12 can thus be carried out by the measurement apparatus 800. Thus, as in the first embodiment, the residual inductances can also be cancelled in the inter-terminal capacitance measurement for the three-terminal device in the third embodiment, and the inter-terminal capacitances can thus be acquired highly precisely.

In addition, according to the third embodiment, a DC voltage-capacitance characteristics for freely selected terminals including the inter-terminal capacitance measurement for a three-terminal device as described above can be measured, and furthermore, a DC measurement including measurement of a current-voltage characteristic of the three-terminal device by the DC measurement apparatus 802 can be carried out by using the DC route selector 806 as well. Thus, according to the third embodiment, the DC voltage-capacitance characteristic and the voltage-current characteristic of the three-terminal device can be measured highly precisely through the automatic connection. Therefore, such an effect that a test for evaluation of a three-terminal device and particularly for evaluation of a three-terminal power device can be carried out very efficiently and highly precisely can be provided.

Furthermore, a measurement apparatus acquired by replacing the LCR meter 102, the route selector 104, and the cables 116 to 120 according to the third embodiment by the LCR meter 702, the router selector 704 and the cables 714 to 720 according to the second embodiment can be a measurement apparatus according to a fourth embodiment of the present invention.

In the above description, the FET is exemplified as the DUT, which is the three-terminal device, but the present invention can be easily applied to other three-terminal devices such as a transistor, a power MOS FET, and an IGBT. In this case, the present invention can be applied by considering the terminal names as corresponding terminal names of a device used as the DUT.

Furthermore, the bias tees 134 to 138 in FIG. 1 can be replaced by other circuits capable of superimposing the bias voltages.

As described above, a description has been given of the methods and the measurement apparatus according to the present invention by following the embodiments of the present invention, but one skilled in the art would understand that the above description is intended for the exemplification, various modifications and replacements can thus be made without departing from an idea thereof, and such a scope is also encompassed in the present invention.

What is claimed is:

1. A method of measuring an inter-terminal capacitance of a device under test including three terminals, having: a route selector including a first terminal connected to a high-side terminal of an LCR meter, a second terminal connected to a low-side terminal of the LCR meter, a third terminal connected to a guard terminal of the LCR meter, a fourth terminal for connecting to a first terminal of the device under test, a fifth terminal for connecting to a second terminal of the device under test, and a sixth terminal for connecting to a third terminal of the device under test, the fourth terminal to the sixth terminal being configured to connect to any of the first terminal to the third terminal; a first cable connected to the fourth terminal of the route selector; a second cable connected to the fifth terminal; and a third cable connected to the sixth terminal, the method comprising:
carrying out, in order to acquire error impedances for routes to the respective terminals of the device under test, measurement for three connections of the route selector;
carrying out, in order to acquire impedances of respective inter-terminal capacitances including errors of residual inductances for the device under test, measurement for the three connections of the route selector; and
acquiring the respective inter-terminal capacitances of the device under test for which carrying out of the measurement in order to acquire the error impedances and in the carrying out of the measurement in order to acquire the impedances of the respective inter-terminal capacitances.

2. A method according to claim 1, wherein:
the carrying out of the measurement in order to acquire the error impedances comprises:
short-circuiting terminals of the first cable, the second cable, and the third cable which are not connected to the route selector with one another; and
connecting the first terminal and the second terminal of the route selector respectively to the fifth terminal and the sixth terminal, to thereby measure a first voltage and a first current by using the LCR meter, connecting the first terminal and the second terminal of the route selector respectively to the fourth terminal and the sixth terminal, to thereby measure a second voltage and a second current by using the LCR meter, and connecting the first terminal and the second terminal of the route selector respectively to the fourth terminal and the fifth terminal, to thereby measure a third voltage and a third current by using the LCR meter;
the carrying out of the measurement in order to acquire the impedances of the respective inter-terminal capacitances comprises:
connecting the terminals of the first cable, the second cable, and the third cable which are not connected to the route selector respectively to the first terminal, the second terminal, and the third terminal of the device under test; and
configuring the route selector so that the first terminal of the route selector is connected to the fifth terminal, the second terminal of the route selector is connected to the sixth terminal, and the third terminal of the route selector is connected to the fourth terminal, to thereby measure a fourth voltage and a fourth current by using the LCR meter, configuring the route selector so that the first terminal of the route selector is connected to the fourth terminal, the second terminal of the route selector is connected to the sixth terminal, and the third terminal of the route selector is connected to the fifth terminal, to thereby measure a fifth voltage and a fifth current by using the LCR meter, and configuring the route selector so that the first terminal of the route selector is connected to the fourth terminal, the second terminal of the route selector is connected to the fifth terminal, and the third terminal of the route selector is connected to the sixth terminal, to thereby measure a sixth voltage and a sixth current by using the LCR meter; and the acquiring of the respective inter-terminal capacitances of the device under test comprises:
acquiring a first impedance from the first voltage and the first current, acquiring a second impedance from the second voltage and the second current, and acquiring a third impedance from the third voltage and the third current;
acquiring an impedance of the first cable, an impedance of the second cable, and an impedance of the third cable from the first impedance to the third impedance;
acquiring a fourth impedance from the first terminal of the route selector via the fifth terminal to an end of the second cable, a fifth impedance from the second terminal of the route selector via the sixth terminal to an end of the third cable, a sixth impedance from the third terminal of the route selector via the fourth terminal to an end of the first cable, a seventh impedance from the first terminal of the route selector via the fourth terminal to the end of the first cable, an eighth impedance from the third terminal of the route selector via the fifth terminal to the end of the second cable, a ninth impedance from the second terminal of the route selector via the fifth terminal to the end of the second cable, and a tenth impedance from the third terminal of the route selector via the sixth terminal to the end of the third cable;
acquiring an eleventh impedance from the fourth voltage and the fourth current, acquiring a twelfth impedance from the fifth voltage and the fifth current, and acquiring a thirteenth impedance from the sixth voltage and the sixth current; and
assigning the fourth impedance to the thirteenth impedance to three simultaneous equations based on Kirchhoff's laws relating to a circuit for measuring the fourth voltage to the sixth voltage and the fourth current to the sixth current, thereby acquiring a fourteenth impedance, a fifteenth impedance, and a sixteenth impedance representing the respective inter-terminal capacitances of the three terminals of the device under test through a numerical analysis method.

3. A method according to claim 2, wherein the route selector superimposes a seventh voltage, an eighth voltage, and a ninth voltage respectively on signals connected to the fourth terminal to the sixth terminal.

4. A method according to claim 1, wherein the acquiring of the fourteenth impedance, the fifteenth impedance, and the sixteenth impedance comprises using a simplex method for the numerical analysis method.

5. A method according to claim 1, wherein:
the first terminal of the route selector is connected to a high-side current terminal and a high-side voltage terminal of the LCR meter; and the second terminal of the route selector is connected to a low-side current terminal and a low-side voltage terminal of the LCR meter.

6. A route selector, comprising:
a first terminal;
a second terminal;
a third terminal;
a fourth terminal;
a fifth terminal; and
a sixth terminal, wherein the fourth terminal to the sixth terminal are configured to connect to any of the first terminal to the third terminal, wherein the route selector is configured to superimpose a seventh voltage, an eighth voltage, and a ninth voltage on signals connected from any of the first terminal to the third terminal to the fourth terminal to the sixth terminal.

7. A route selector according to claim 6, wherein the configuration of the route selector capable of superimposing the seventh voltage, the eighth voltage, and the ninth voltage comprises a first bias tee, a second bias tee, and a third bias tee corresponding to signal lines respectively connected to the fourth terminal to the sixth terminal, and a seventh terminal, an eighth terminal, and a ninth terminal connected to the first bias tee to the third bias tee, and the route selector is configured to superimpose voltages applied to the seventh terminal to the ninth terminal on the signal lines respectively connected to the fourth terminal to the sixth terminal.

8. A route selector according to claim 6, wherein:
the route selector comprises a tenth terminal and an eleventh terminal;
the tenth terminal is connected to the first terminal; and
the eleventh terminal is connected to the second terminal.

9. A measurement apparatus, comprising:
a first route selector that is the route selector of claim 6;
an LCR meter;
a device under test, which is a three-terminal device;
a first cable, a second cable, and a third cable for respectively connecting the fourth terminal to the sixth terminal of the first route selector and a first terminal, a second terminal, and a third terminal of the device under test to each other; and
a fourth cable, a fifth cable, and a sixth cable for respectively connecting the first terminal to the third terminal of the first route selector and a first terminal, a second terminal, and a third terminal of the LCR meter to each other.

10. A measurement apparatus according to claim 9, wherein:
the first terminal of the LCR meter comprises a high-side terminal;
the second terminal of the LCR meter comprises a low-side terminal; and
the third terminal of the LCR meter comprises a guard terminal.

11. A measurement apparatus according to claim 9, wherein the LCR meter is capable of superimposing voltages respectively on the first terminal to the third terminal.

12. A measurement apparatus according to claim 9, wherein:
the first route selector comprises a tenth terminal and an eleventh terminal;
the tenth terminal of the first route selector is connected to the first terminal;
the eleventh terminal of the first route selector is connected to the second terminal;
the LCR meter comprises a fourth terminal and a fifth terminal;
the first terminal and the fourth terminal of the LCR meter comprise high-side terminals;
the second terminal and the fifth terminal of the LCR meter comprise low-side terminals;
the third terminal of the LCR meter comprises a guard terminal;
the fourth terminal of the LCR meter is connected to the tenth terminal of the first route selector via a seventh cable; and
the fifth terminal of the LCR meter is connected to the eleventh terminal of the first route selector via an eighth cable.

13. A measurement apparatus according to claim 12, wherein the LCR meter is capable of superimposing voltages respectively on the first terminal to the fifth terminal.

14. A measurement apparatus according to claim 9, further comprising:
a DC measurement apparatus for supplying a DC voltage of at least one channel;
a second route selector capable of connecting any of the at least one channel of the DC measurement apparatus to a first terminal, a second terminal, and a third terminal of the second route selector; and
a third route selector including the first route selector and the second route selector, capable of connecting one of the fourth terminal of the first route selector and the first terminal of the second router selector to a first terminal, capable of connecting one of the fifth terminal of the first route selector and the second terminal of the second router selector to a second terminal, and capable of connecting one of the sixth terminal of the first route selector and the third terminal of the second router selector to a third terminal,
wherein the first cable, the second cable, and the third cable connected to the first terminal, the second terminal, and the third terminal of the device under test are respectively connected to the first terminal, the second terminal, and the third terminal of the third route selector.

* * * * *